(12) United States Patent
Petrov

(10) Patent No.: US 9,377,595 B2
(45) Date of Patent: Jun. 28, 2016

(54) PHOTOELECTRIC CONDUCTIVE MOTHERBOARD AND MODULAR SYSTEM

(71) Applicant: Stan C. Petrov, Costa Mesa, CA (US)

(72) Inventor: Stan C. Petrov, Costa Mesa, CA (US)

( * ) Notice: Subject to any disclaimer, the term of this patent is extended or adjusted under 35 U.S.C. 154(b) by 140 days.

(21) Appl. No.: 14/103,612

(22) Filed: Dec. 11, 2013

(65) Prior Publication Data

US 2015/0160411 A1    Jun. 11, 2015

(51) Int. Cl.
G02B 6/12 (2006.01)
G02B 6/43 (2006.01)
G02B 6/122 (2006.01)
H05K 1/02 (2006.01)
G02B 6/42 (2006.01)

(52) U.S. Cl.
CPC *G02B 6/43* (2013.01); *G02B 6/122* (2013.01); *H05K 1/0274* (2013.01); *G02B 6/428* (2013.01)

(58) Field of Classification Search
None
See application file for complete search history.

(56) References Cited

U.S. PATENT DOCUMENTS

| | | | | |
|---|---|---|---|---|
| 2,933,458 A * | 4/1960 | Burnham | ............... | C03C 3/062 252/520.2 |
| 5,555,341 A * | 9/1996 | Sharma | ............... | G02B 6/4231 385/123 |
| 5,887,116 A * | 3/1999 | Grote | ............... | G02F 1/065 385/122 |
| 2014/0016896 A1* | 1/2014 | Hanazono | ............... | G02B 6/12 385/14 |

FOREIGN PATENT DOCUMENTS

JP    WO 2015033845 A1 *   3/2015   ............... G02B 6/43

OTHER PUBLICATIONS

Machine translation of WO2015/033845 A1.*

* cited by examiner

*Primary Examiner* — Sung Pak

(57) ABSTRACT

A photoelectric conductive motherboard with electronic modules. The multilayer board conducts electricity to provide power for the individual modules, and concurrently propagates light allowing the modules to communicate with each other by an integrated array of light emitters and receivers that are paired by wavelength and intensity. Large amounts of information can be transmitted between the modules simultaneously, at extremely high speeds, without the need for additional hardware.

18 Claims, 9 Drawing Sheets

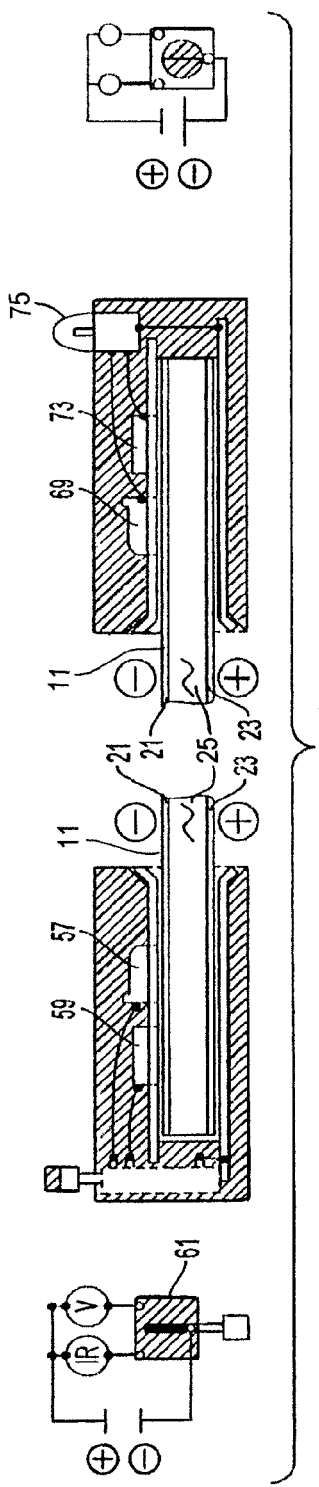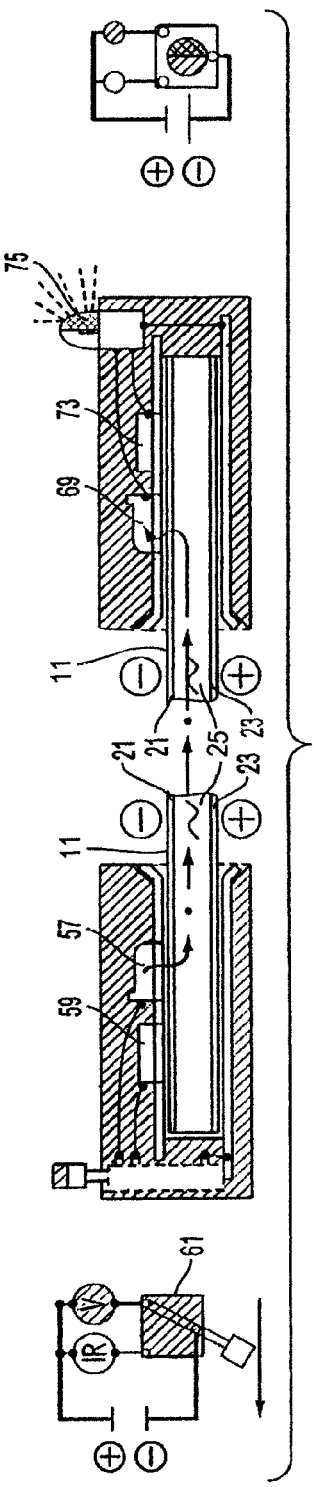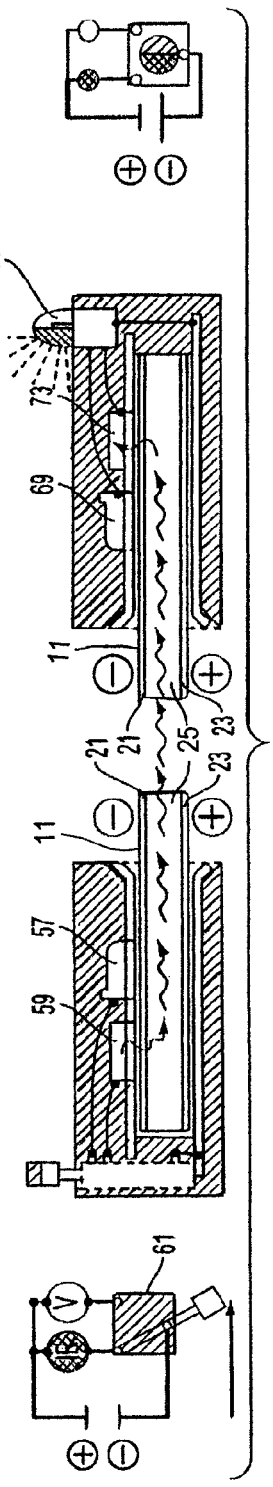

PHOTOELECTRIC CONDUCTIVE MOTHERBOARD AND MODULAR SYSTEM

BACKGROUND OF THE INVENTION

1. Field of the Invention

The present invention relates to a photoelectric conductive motherboard for electronic modules and a photoelectric modular system.

2. Description of Related Art

Most devices and tools today contain electrical components. Even toys are becoming increasingly interactive with more and more electronic parts. Modern appliances, cars, and even furniture can contain electronic components. Both cell phones and computers have become necessities in most every household.

Although these devices benefit our society, they cause a significant problem: e-waste. Three million tons of e-waste is generated each year in the U.S. Landfills now contain 70-80% electronics, much of which contains hazardous materials such as lead, nickel, cadmium and mercury. Since e-waste also contains valuable elements, gold, copper, silver, palladium and platinum, discarded consumer electronics are not only a significant source of pollution, they are also a waste of our natural resources. Less than 20% of electronics are recycled. It has been estimated that the amount of e-waste being generated may increase by up to 500% over the next decade.

This situation is exacerbated by the trend of adding even more functions to electronics. The heart of all of these devices is the printed circuit board (PCB). Multiple tracks interconnect various electronic components that have been permanently positioned on the board using tin-containing and possibly leaded solder. Furthermore, because many devices require more than one PCB, multiple cables and connectors are required to interconnect the PCB's. As the number of connections increases, it becomes necessary to include components whose sole purpose is to encode, transmit and decode various types of information. Increasing the amount of hardware and data that must be processed, eventually slows the operation of the device. Manufacturers have responded by increasing speed, which requires additional energy, larger and more powerful batteries, and so on. This escalates the e-waste.

Efficiently functioning electronics require that components are securely and permanently fastened to the PCB, preventing the incursion of dust, dirt, and moisture, all of which interfere with electrical signals, by affecting the connections. The very nature of the electronics is to continuously advance, with improved components and increased functions. This makes it desirable for the consumer to discard the old electronics rather than repair or upgrade, even if only one of the components is faulty or out of date.

What is required is a way of integrating components that allows upgrading or replacement of faulty parts without the need for special instruments or tools. This requires a system that allows interconnection of various components and transmission of large amounts of information without dedicated wires and channels, multiple connectors, and tracks, allowing the consumer to move and change components at will. Such a system would decrease pollution, production costs and wasting of environmental resources while simultaneously decreasing cost and increasing convenience to the consumer. Decreasing wires and tracks would reduce inductive properties, giving such a device an increased level of resistance to natural and artificially generated electromagnetic shock fields.

The opinion of engineers today seems to be that such a thing cannot be done. According to one, " . . . to make all the integrated circuits properly talk to each other while dealing with the electromagnetic conductance issues; metal cages around components, thousands of signal paths of multiple layers of the PCB, packing signal lines between power planes, running signal lines in zigzags to produce equidistant signal paths . . . " is not feasible. Another has stated, "A CPU needs to be incredibly reliant on connections (that's why they are soldered in). We do live in a world of millions of never going to happens . . . most of these things never happen because of the fact that they can't be done."

Many companies and research institutions are searching for a technology that allows the free interchange of components, reduces production costs, reduces waste, while increasing the speeds, power, and efficiency of electrical devices.

Patents have been granted on conductive glass and transmission of data by light energy. Motorola and Google are working on a cooperative project attempting to build a modular phone. No one has come up with a system that addresses the above noted issues. The present invention does.

SUMMARY OF THE INVENTION

The present invention is directed to a photoelectric conductive motherboard with photoelectric modules. The board has multiple layers for conducting electricity to provide power for the individual modules and concurrently propagating modulated light, allowing the connected modules to communicate. Integrated arrays of emitters and receivers are paired by wavelength and intensity. Multiple module pairs use the same light conductive layer on the motherboard without mutual interference. Information is carried between the modules simultaneously at high speeds.

BRIEF DESCRIPTION OF THE DRAWINGS

The exact nature of this invention, as well as the objects and advantages thereof, will become readily apparent upon consideration of the following specification in conjunction with the accompanying drawings in which like reference numerals designate like parts throughout the figures thereof and wherein:

FIG. 16 is a cross-section of the motherboard illustrating the operation of the motherboard;

FIG. 17 is a cross-section of the motherboard illustrating the operation of the motherboard; and FIG. 18 is a cross-section of the motherboard illustrating the operation of the motherboard.

DETAILED DESCRIPTION OF THE PREFERRED EMBODIMENTS

Figure 1:
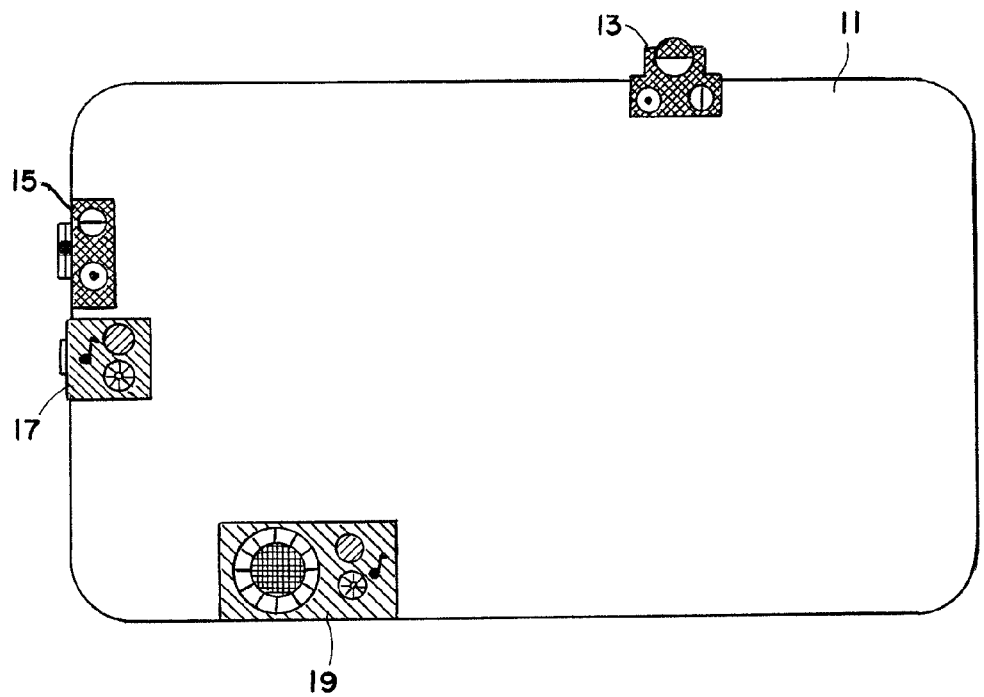
FIG. 1 is a front view of the photoelectric conductive motherboard, showing light and sound modules in place.
Figure 2:
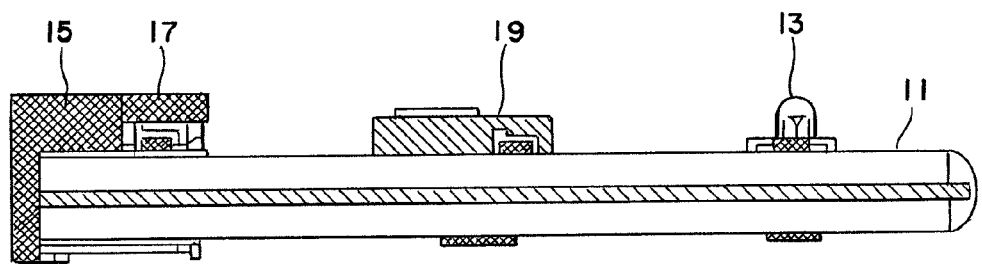
FIG. 2 is a cross-section of the motherboard of FIG. 1.

A preferred embodiment of the front external surface of the photoelectric conductive motherboard 11 and modular system, is shown in FIGS. 1 and 2. The modules 13, 15, 17 and 19 are in direct contact with the outer layers of the transparent photoelectric conductive layered board 11. It is important to note that these components, whether a light switch 15, a multicolor light diode 13, audio input 17, or audio output 19, can be placed virtually anywhere on the board 11 and still function at full capacity. They are able to both receive power and communicate.

Figure 3:
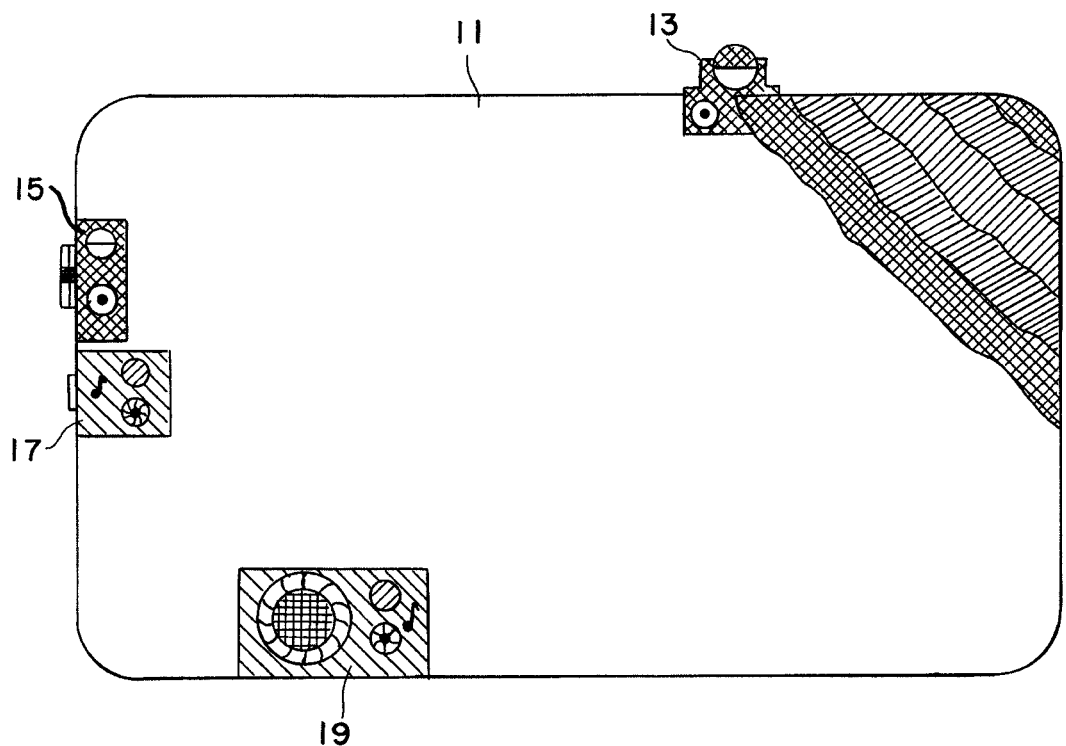
FIG. 3 is a front view of the motherboard showing the multilayer composition.
Figure 4:
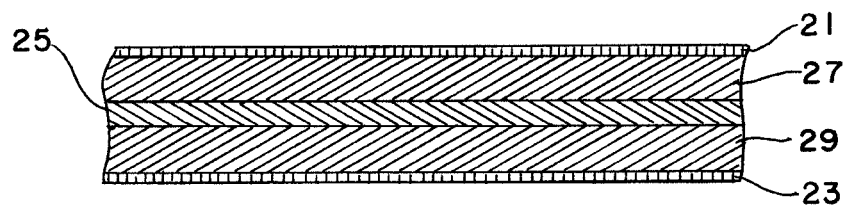
FIG. 4 is a cross-section of the motherboard of FIG. 3.

FIGS. 3 and 4 detail the various layers of the photoelectric board 11, both as viewed from the top and in cross section. The outermost layers 21, 23 are constructed of electrically and photo conductive, partially light reflective, transparent glass, polymers, or similar material. These layers also serve as electrical conductors to supply power to the attached modules. The central layer 25 is a photoconductive layer, efficiently and evenly propagating and partially diffusing the light evenly throughout the entire board 11. Sandwiched between the electrically and photo conductive layers 21, 23 and the photoconductive layer 25 are nonelectrically conductive, photo conductive layers 27, 29 that prevent shorts that would occur should power be conducted between the top layer 21 and bottom layer 23.

Figure 5:
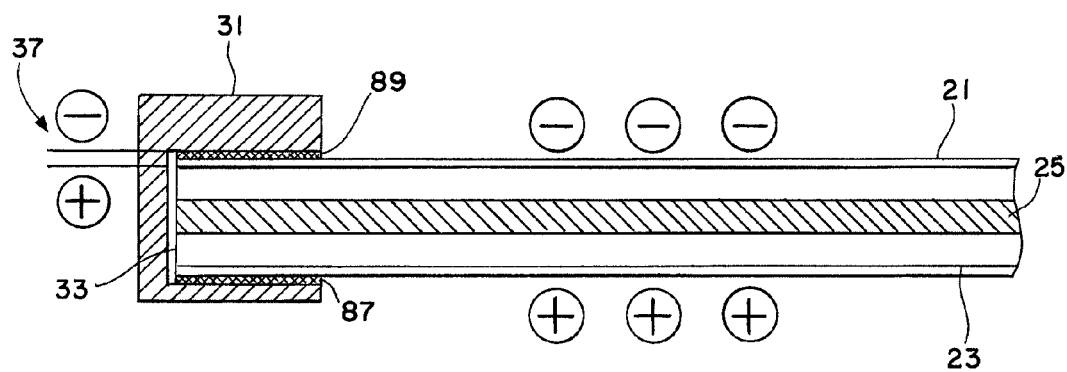
FIG. 5 is a cross-section of the motherboard connected to a power source.
Figure 5A:
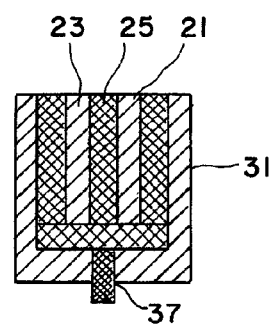
FIG. 5A is an illustration of the motherboard connected to multiple light transmitting modules.

Power can be supplied to the photoelectric motherboard in multiple ways. The preferred method is shown in FIGS. 5, 5A. An electric power source module 31 having a nonconductive housing contains a set of conductive tracks 87, 89. The tracks are connected to power source wires 37. The track 87 connects power to the positive electroconductive layer 23. The track 89 connects power to the negative layer 21. When the power module is in place, power is transferred by the tracks 89, 87 to the entire surface of the electrically conductive layers 21, 23. Any modules connecting to any place or point on these two surfaces 21, 23 on the motherboard 11 are energized.

Figure 6:
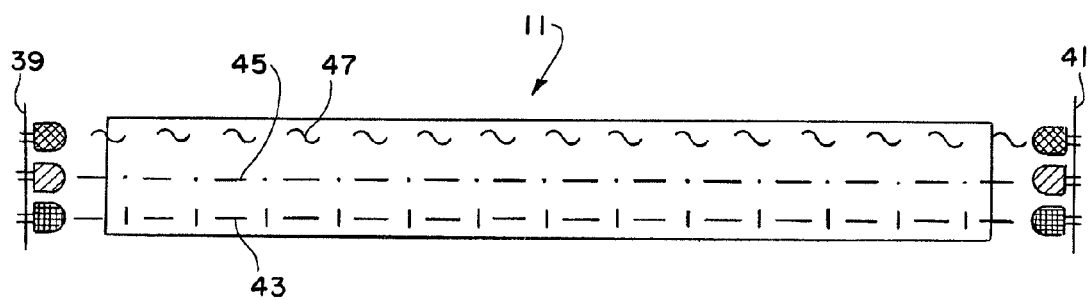
FIG. 6 is a cross-section schematic illustration of the motherboard transmitting different light waves.
Figure 7:
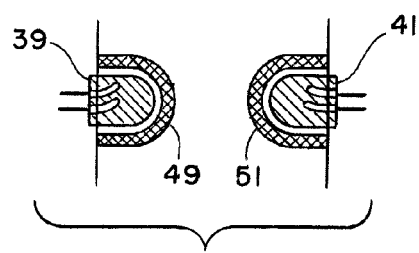
FIG. 7 is a detailed illustration of an emitter and a receiver pair, each with their respective filters.

The photocommunication between modules through the motherboard 11 is illustrated in FIG. 6. Transmitter/receiver modules 39, 41 placed on the photo and electrically conductive surface of the motherboard 11 allow for simultaneous creation of multiple light channels 43, 45, 46 that transfer and receive data through the photoconductive layers shown in FIG. 4. Referring to FIG. 5, the light sources 39 (diodes in the preferred embodiment) and receivers 41 emit and detect, respectively, different and specifically preset types of light waves 43, 45, 47 so that there is no interference between signals. This may be achieved by coating the emitters 39 and receivers 41 with a particular light filter 49, 51 so that they are perfectly paired. Alternatively, the light may be segregated by frequency. Visible and infrared receivers and transmitters could be utilized. For example, to preprogram and create multiple channels and allow for an increased amount of data to be transmitted simultaneously, a multicolor LCD (not shown) can be used. As the color of the LCD is varied, the frequency of the light waves emitted and received are altered, allowing components to be paired or turned in real time. It also makes it possible to group or remove components at will without physically or mechanically altering them. Each selected frequency range for the LCD emitted light waves, serves as a separate data channel. This allows for multiple channels to be easily created.

Figure 8:
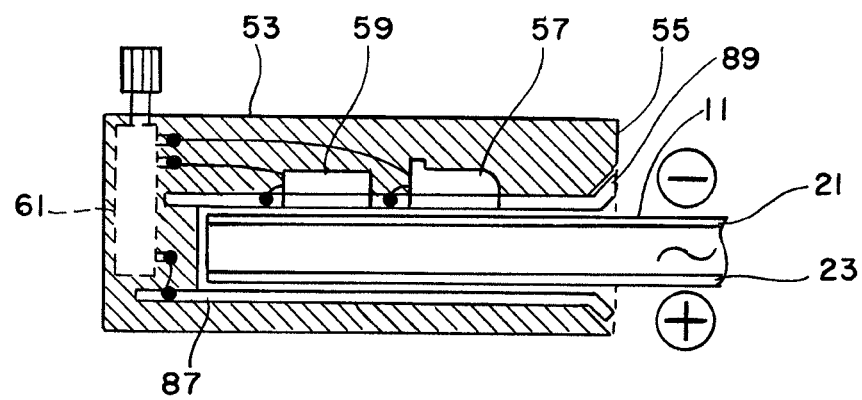
FIG. 8 is a cross-section of the motherboard connected to a light switch module.
Figure 9:
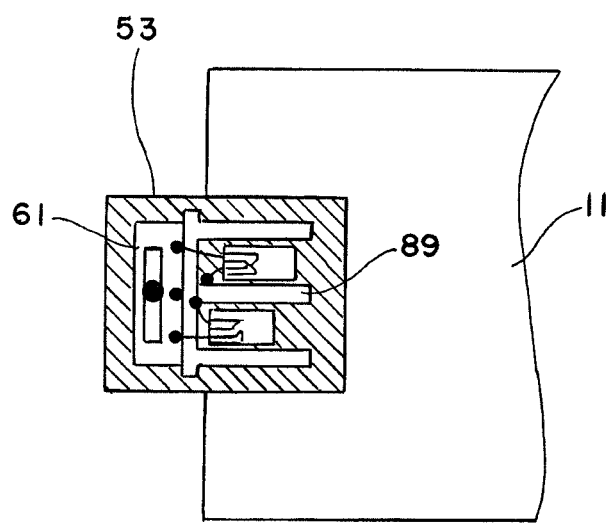
FIG. 9 is a top view of the motherboard showing a cross-section of the light switch module of FIG. 8.

FIGS. 8 and 9 are an illustration of the preferred embodiment of the photoelectric conductive motherboard 11 connected to a light switch module 53. The module, shown as attached to an end of the motherboard 11, comprises a non-electrically conductive housing 55 that contains an imbedded infrared light emitting diode 57 and a visible light emitting diode 59. The negative legs of both diodes are directly grounded via an electroconductive track 89 to the negative electroconductive plate 21. The positive legs of the light emitters are indirectly attached via wires to a three way switch 61 that is also connected to a positive track 87 that is in contact with the positive electroconductive plate 23. Note that the module lies in contact with the outer layers of the motherboard and derives power from it. The diode can transmit light through all the layers and to all components attached to the motherboard.

Figure 10:
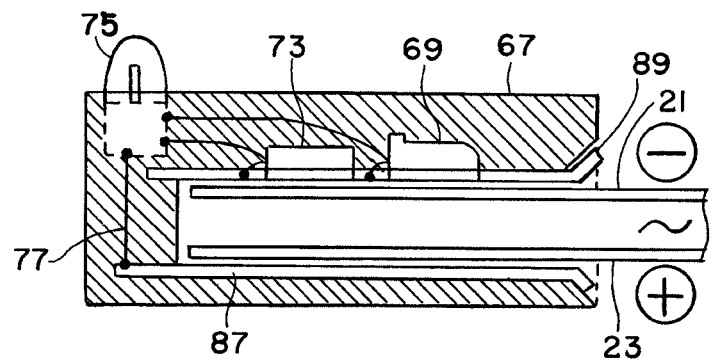
FIG. 10 is a cross-section of the motherboard connected to an LED light module.
Figure 11:
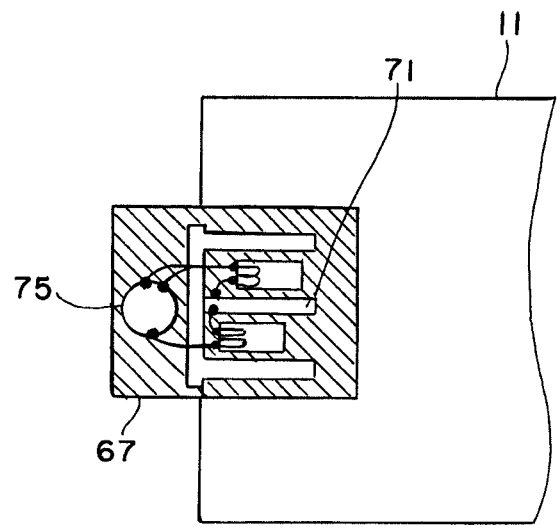
FIG. 11 is a front view of the motherboard with a cross-section of the LED light module.

In the preferred embodiment, this light switch module 53 is paired with a bicolor light module 67 (FIGS. 10 and 11) that is similar in design and concept to the switch module, but distinct in that the light emitters have been replaced with receivers, light detecting diodes 69, 73 that detect visible and infrared light, respectively. In this module, the three way switch has been replaced with a bicolor green and red LED 75. The negative terminal of the multicolor light LED 75 is indirectly connected to a negative electroconductive track 89 and plate 21 via the infrared and visible light detecting diodes. The positive terminal is directly connected to the positive plate 23 via a positive track 87 and a common positive wire 77 connecting the track to the diode.

No matter where the light switch module 53 and the multicolor light module 67 are placed on the photoelectric conductive motherboard 11 (FIG. 8), it is possible to selectively manipulate which colors the LED 75 displays without physically interconnecting the three way switch 53 and multicolor LED 75 (FIG. 10) by wires or tracks. This light communication can be used to transmit data on several channels simultaneously, even extending to information encoded as video and sound, as will be described hereinafter.

Figure 12:
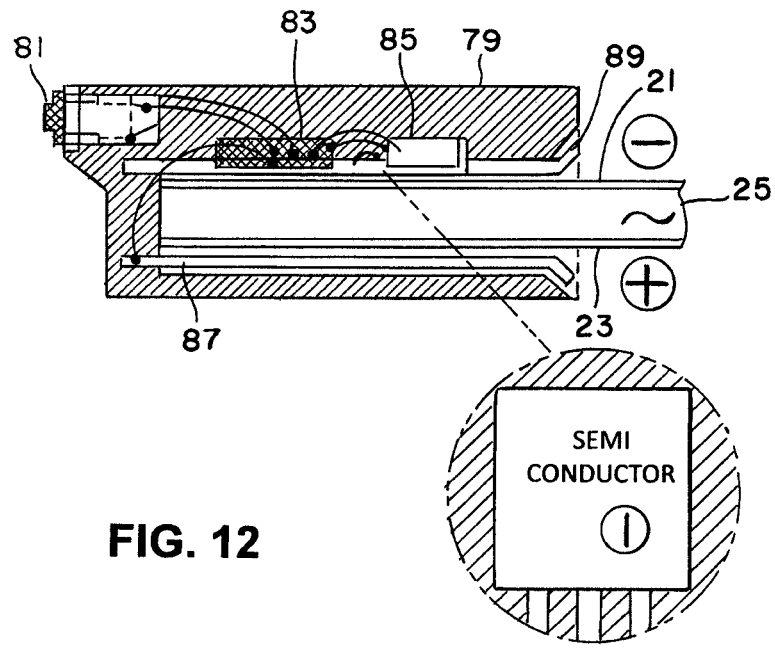
FIG. 12 is a cross-section of the motherboard connected to an audio input module.
Figure 13:
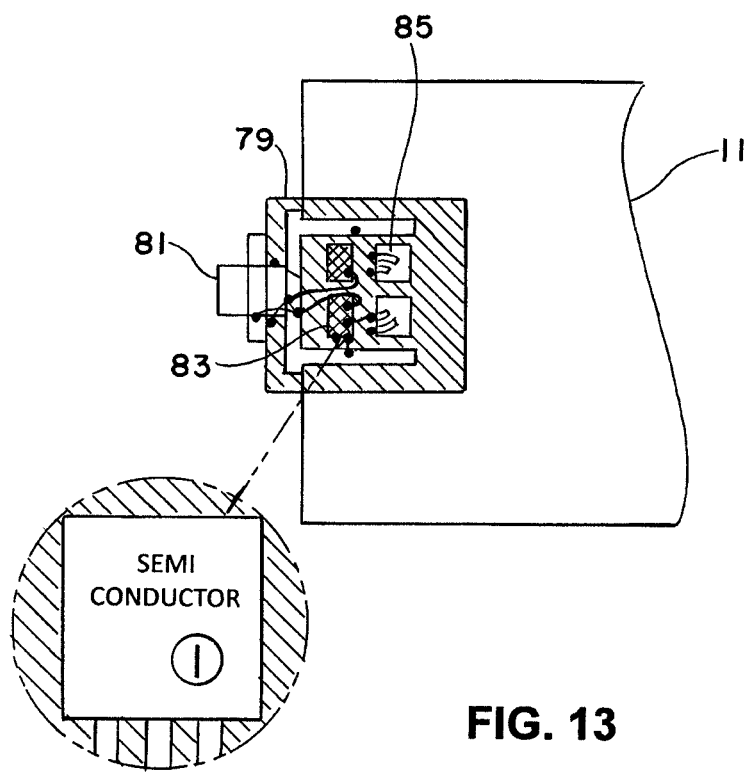
FIG. 13 is a front view of the motherboard with a cross-section of the audio input module storing fast switching electronic components (semiconductors) connected to the electrical input and light emitters.

FIGS. 12 and 13 show an audio input module 79, which is similar in terms of design to the above described modules. However, it has modifications that allow it to work with the photoelectric conductive motherboard 11. In this embodiment, an audio input signal is fed via headphone jacks 81 into two fast switching semiconductor components 83. These semiconductors are individually connected to light emitting diodes 85. One fast switching component is directly and permanently connected to the positive photo and electrically conductive plate 23 via a positive track 87 and the positive leg of the light emitting diode. The negative leg of the diode is connected to the ground by way of the track and the photo and electrically conductive plate. The other fast switching component is directly connected to the negative photo and electrically conductive plate by the negative track 89 and the negative leg of the diode. That is, the audio input module has a set of preset light emitters that are connected to their power supply via one of their poles individually via a semiconductor. In order for them to complete their circuit and receive the missing positive or negative power, they rely on the paired semiconductors to become excited and conductive by the low voltage audio signal input, which will be positive or negative depending on the type of semiconductor (PNP or NPN).

Figure 14:
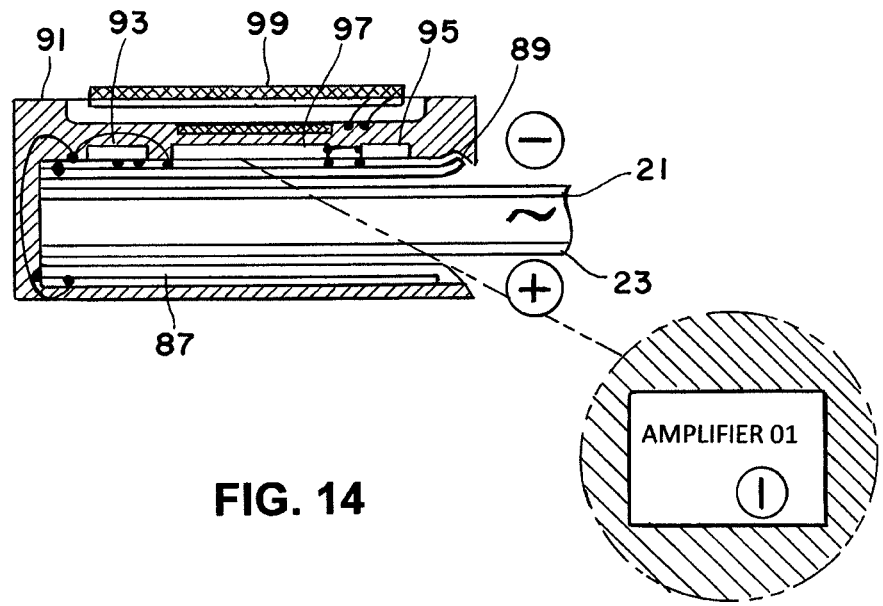
FIG. 14 is a cross-section of the motherboard connected to an audio output module.
Figure 15:
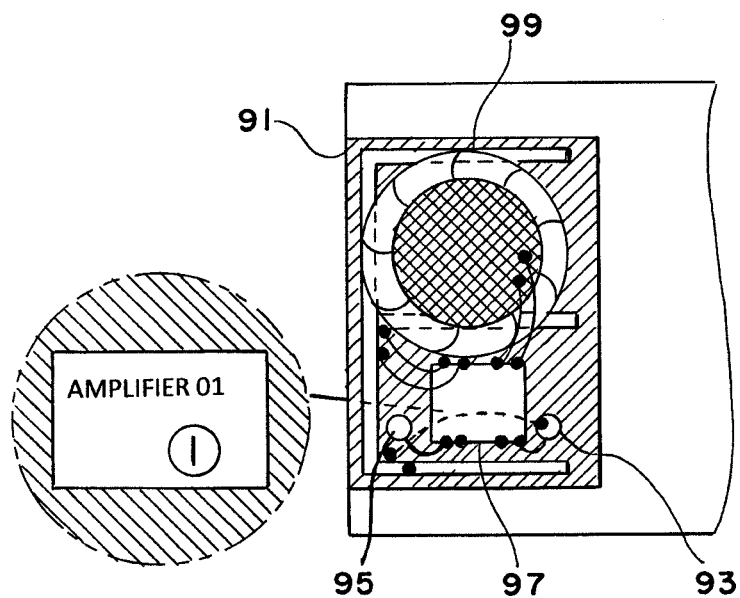
FIG. 15 is a top view of the motherboard with a cross-section of the audio output module.

The audio input module 79 is paired with an audio output module 91 shown in FIGS. 14 and 15. The audio output module 91 is constructed in the same basic manner as the above described modules, with the following modifications. The positive and negative poles of a specific set of light receivers 93 and 95 are permanently attached to the positive or negative track 87, 89, which is in contact with the photo and electrically conductive power plate, respectively. The other pole of these light receivers 93, 95 is attached to the matching pole of an amplifier 97 that receives its power from tracks adjacent to and in contact with the positive 23 or negative 21 plates of the board 11. A set of wires attached to the amplifier's positive and negative output permanently connects to a speaker 99. As the audio input module's emitters produce light of specific wavelengths and intensity, the light propagates through the photo and electrically conductive layer of the entire board until it excites the specific receivers 93, 95 of the audio output module 91, making the output module 91 more conductive. In this way, variable amounts of voltage, based on the wavelength and intensity of the light, are allowed to input into the positive and negative channel inputs of the amplifier 97 that is simultaneously powered by the positive 87 and negative 89 track that are in contact with the board 11. As a result, an amplified sound signal is outputted by the positive and negative outputs of the amplifier module 91 and by wires, powers the speaker 99 to produce sound.

These sound modules show how some semiconductor components utilized in current technologies can easily be modified to be used with and powered by the photoelectric conductive motherboard. A working prototype has been produced. The prototype shows that the photoelectric conductive motherboard can handle multiple channels of data simultaneously, without interference, regardless of the originating form, whether light, sound or video.

The operation of the photo and electrically conductive motherboard 11 and some modules can be seen in FIGS. 16, 17 and 18. The three positions of the switch 61 are as shown on the left in FIGS. 16, 17, and 18.

In FIG. 16, the switch 61 is in neutral position, no light is emitted, no signal is sent, and the emitter LED 57 does not light.

In FIG. 17, the switch is pushed to the left and the visible light circuit is closed, causing the light source LED 57 to light up. The light from LED 57 is propagated through the conductive media 21, 23, 25 of the motherboard 11 and reaches the visible light sensitive receiver 69. When this receiver is excited, the electric circuit on the green side of the multicolor diode 75 is closed and the diode produces green visible light.

In FIG. 18, the switch 61 is pushed to the right. This causes an infrared diode 59 to light up, the light is propagated throughout the motherboard 11 to a paired infrared receiver 73, closing a circuit that causes the multicolor LED 75 to produce red light.

The photoelectric conductive motherboard can interconnect various components without soldering, cables, sockets, and so on. The motherboard facilitates an infinite number of combinations of components or modules to be placed together on the board for power and communication. This allows new levels of customization, increasing the numbers of types of devices that can be produced. Almost no copper is used in construction, leading to a device with a very low coefficient of conductance. The photoelectric conducting motherboard can use currently available electrical components including, but not limited to semiconductors, such as microprocessors and amplifiers, by simply being paired with appropriate light emitter and receiver arrays.

The present invention is beneficial for many reasons. First, it allows a user without special skills and equipment to add or replace any module or component desired. And since the emitting modules can only communicate with the receiving modules that detect their specific wavelength or intensity of light, it is possible for multiple light channels to be created and various types of information to be propagated at the same time, interconnecting all of the components. This results in a system of extraordinary power quality and utility. For example, if a user would like to build a cell phone, all that is necessary is to place the modified core components (processor, microphone, antenna, speaker, etc.) anywhere onto the board and it will function, that is, power-up and communication. If repair, upgrade or just customization is desired, the user can simply replace or add the modules of choice.

Another benefit of the invention is that it can work together with existing technology. All that is required is to pair the inputs and outputs of the various currently-available semiconductors, such as processors with preset light emitters and receivers, essentially resulting in the data from the processors being inputted and outputted in terms of light instead of the usual electrical impulse connections. Current technology's micro circuitry is not wasted, since only minor modification is needed for it to be integrated with the invention.

An obvious advantage of above is an inevitable immediate reduction in e-waste, both in terms of toxins generated during manufacture and in terms of discarded electronics. Since this invention can consist of a type of conductive glass, it does not require the use of the same quantities of precious metals as are utilized in current electronic construction. Bigger batteries with greater capabilities, as are required for increased speeds when many components must communicate quickly, will also become unnecessary. The invention communicates at the speed of light. Because the components are entirely replaceable, the user can replace faulty components, upgrade the device at will, and customize as desired. There will be no more need to discard functional electrical equipment because of the failure of one part. One can just replace the part or even repurpose the entire device for another use. Turning your modular cell phone into a router, for example, would be simple.

Because communication is between modules is established by the use of light instead of multiple tracks and wires, the chance of failure due to environmental factors is negligible. Water will not be able to render the device inoperable by shorting out tracks since, as soon as the device is dry, operation will resume. The device is also more resistant than conventional motherboards to high temperatures, which usually cause increasing resistance within the tracks, eventually decreasing speed and efficiency. In comparison, communication via light is not affected by temperature.

The foregoing description of a preferred embodiment of the invention was presented for illustration and description. It was not intended to limit the invention to a precise form. Those skilled in the art will understand how to best utilize the invention in various embodiments and various modifications as best suited to the use contemplated. The scope of the invention should not be limited by the specification, but defined by the following claims.

What is claimed is:

1. A photoelectric board for simultaneously providing power and communication channels to electronic modules in contact with the board, comprising:
   a middle non-electroconductive layer of photoconductive material having a length, width, top and bottom surface, for propagating light waves throughout the entire layer;
   a top layer of electrically and photo-conductive material having a length and width, placed over the top surface of the middle layer of photoconductive material for conducting electrical current in all directions and propagating light waves into the non-electroconductive layer; and
   a bottom layer of electrically and photo-conductive material having a length and width, placed over the bottom surface of the middle layer of photoconductive material for conducting electrical current in all directions and propagating light waves into the non-electroconductive layer.

2. The photoelectric board of claim 1 further comprising:
   a layer of electrically non-conductive material located between the top electrically and photo conductive layer and the top surface of the middle layer of photoconductive material; and
   a layer of electrically non-conductive material located between the bottom electrically conductive layer and the bottom surface of the middle layer of photoconductive, electrically non-conductive material.

3. The photoconductive board of claim 1 further comprising a power source connected to the top electrically conductive layer and bottom electrically conducive layer.

4. The photoelectric board of claim 3 wherein the power source comprises at least a pair of outputs, one having a positive polarity, the other having a negative polarity, one output connected to the bottom layer, the other output connected to the top layer.

5. The photoelectric board of claim 4 wherein the positive and negative outputs of the power source are connected to the top and bottom conductive layers by a top and bottom conductive track contained within the power source, the top and bottom tracks making physical contact with the respective top and bottom conductive layers.

6. The photoelectric board of claim 1 wherein the middle layer is a light wave transmitting and diffusing material and an electrical insulator.

7. The photoelectric board of claim 1 wherein the top and bottom electrically conductive layers are electrically conductive glass with light reflection and conduction properties.

8. The photoelectric board of claim 1 further comprising a transmitter/receiver module indirectly connected to the middle layer of photoconductive material for transmitting and receiving light waves through the middle layer.

9. The photoelectric board of claim 8 wherein multiple transmitter/receiver modules are in indirect communication with the middle layer of photoconductive material, each transmitter/receiver module tuned to a predetermined frequency band for transmitting and receiving light only in a respective frequency band.

10. The photoelectric board of claim 8 wherein multiple transmitter/receiver modules are in communication with the middle layer of photoconductive material by the electrically conductive layer that also powers the modules, each transmitter/receiver module tuned to a predetermined light wave for transmitting and receiving only that light wave.

11. The photoelectric board of claim 8 further comprising an information source connected to the transmitter/receiver module powered by the photoconductive layer for modulating the transmitted light waves and selecting received modulated light waves.

12. The photoelectric board of claim 8 further comprising an audio source powered by the photoelectric layer connected to the transmitter/receiver module for modulating the transmitted light waves and detecting the received modulated light waves.

13. The photoelectric board of claim 9 further comprising a speaker connected to the receiver semiconductor powered by the semitransparent electrically conductive top and bottom layers.

14. The photoelectric board of claim 1 further comprising:
   a power source connected to the top layer and bottom layer;
   a transmitter/receiver module connected to the middle layer and the top and bottom layer; and
   an information source connected to the transmitter/receiver module for modulating the transmitted light waves and detecting received modulated light waves.

15. The photoelectric board of claim 14 wherein multiple light transmitter/receiver modules are indirectly connected to the middle layer and powered by the top and bottom layer, each transmitter/receiver module tuned to a predetermined light frequency band for transmitting and receiving light only in a respective light frequency band.

16. The photoelectric board of claim 14 wherein multiple light transmitter/receiver modules are connected to the middle layer and indirectly to the top and bottom layer, each transmitter/receiver module tuned to a predetermined light intensity level.

17. The photoelectric board of claim 14 wherein the transmitter/receiver module comprises a color LCD capable of changing from one color light frequency band to another.

18. The photoelectric board of claim 1 wherein the top layer and bottom layer of electrically and photoconductive materials reflect some light towards the middle layer of photoconductive material.

* * * * *